United States Patent
Ke et al.

(10) Patent No.: US 7,863,740 B2
(45) Date of Patent: Jan. 4, 2011

(54) SEMICONDUCTOR DEVICE HAVING CONDUCTIVE BUMPS, METALLIC LAYERS, COVERING LAYERS AND FABRICATION METHOD THEREOF

(75) Inventors: Chun-Chi Ke, Taichung Hsien (TW); Chien-Ping Huang, Hsinchu Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 120 days.

(21) Appl. No.: 12/005,483

(22) Filed: Dec. 26, 2007

(65) Prior Publication Data

US 2008/0211093 A1    Sep. 4, 2008

(30) Foreign Application Priority Data

Dec. 27, 2006    (TW)    ............... 95149156 A (51) Int. Cl.
    H01L 23/48    (2006.01)
    H01L 23/52    (2006.01)
    H01L 29/40    (2006.01)
(52) U.S. Cl. ............ 257/737; 257/738; 257/758; 257/779; 257/780
(58) Field of Classification Search .......... 257/737, 257/738, 758, 778, 779, 780
    See application file for complete search history.

(56) References Cited

U.S. PATENT DOCUMENTS

| | | | |
|---|---|---|---|
| 5,466,635 A | 11/1995 | Lynch et al. | |
| 5,656,858 A * | 8/1997 | Kondo et al. | 257/737 |
| 6,107,180 A | 8/2000 | Munroe et al. | |
| 6,111,321 A | 8/2000 | Agarwala | |
| 6,229,220 B1 | 5/2001 | Saitoh et al. | |
| 6,396,148 B1 * | 5/2002 | Eichelberger et al. | 257/758 |
| 6,579,754 B2 | 6/2003 | Suenaga et al. | |
| 6,586,323 B1 | 7/2003 | Fan et al. | |
| 6,621,154 B1 * | 9/2003 | Satoh et al. | 257/684 |
| 6,759,739 B2 * | 7/2004 | Nakamura et al. | 257/700 |
| 6,770,971 B2 * | 8/2004 | Kouno et al. | 257/734 |
| 6,841,875 B2 * | 1/2005 | Ohsumi | 257/738 |
| 6,861,754 B2 * | 3/2005 | Lin et al. | 257/758 |
| 6,992,391 B2 * | 1/2006 | Ott et al. | 257/758 |
| 6,998,711 B1 * | 2/2006 | Farrar | 257/737 |
| 7,141,879 B2 * | 11/2006 | Wakamiya et al. | 257/750 |
| 2001/0008311 A1 * | 7/2001 | Harada et al. | 257/758 |
| 2003/0080428 A1 * | 5/2003 | Izumitani et al. | 257/758 |
| 2003/0178726 A1 * | 9/2003 | Ogawa et al. | 257/758 |

(Continued)

*Primary Examiner*—Teresa M Arroyo
(74) *Attorney, Agent, or Firm*—Peter F. Corless; Steven M. Jensen; Edwards Angell Palmer & Dodge LLP (57) ABSTRACT

A semiconductor device having conductive bumps and a fabrication method thereof is proposed. The fabrication method includes the steps of forming a first metallic layer on a substrate having solder pads and a passivation layer formed thereon, and electrically connecting it to the solder pads; applying a second covering layer over exposed parts of the first metallic layer; subsequently, forming a second metallic layer on the second covering layer, and electrically connecting it to the exposed parts of the first metallic layer; applying a third covering layer, and forming openings for exposing parts of the second metallic layer to form thereon a conductive bump having a metallic standoff and a solder material. The covering layers and the metallic layers can provide a buffering effect for effectively absorbing the thermal stress imposed on the conductive bumps to prevent delamination caused by the UBM layers.

6 Claims, 5 Drawing Sheets

U.S. PATENT DOCUMENTS

| | | | |
|---|---|---|---|
| 2004/0075991 A1* | 4/2004 | Haba et al. | 361/777 |
| 2004/0155352 A1* | 8/2004 | Ma | 257/758 |
| 2005/0098891 A1* | 5/2005 | Wakabayashi et al. | 257/758 |
| 2005/0161823 A1* | 7/2005 | Jobetto et al. | 257/758 |
| 2006/0192287 A1* | 8/2006 | Ogawa et al. | 257/758 |
| 2006/0249848 A1* | 11/2006 | Coolbaugh et al. | 257/758 |

* cited by examiner

SEMICONDUCTOR DEVICE HAVING CONDUCTIVE BUMPS, METALLIC LAYERS, COVERING LAYERS AND FABRICATION METHOD THEREOF

BACKGROUND OF THE INVENTION

1. Field of the Invention

The present invention generally relates to semiconductor devices and fabrication methods thereof, and more particularly, to a semiconductor device having conductive bumps and a fabrication method thereof.

2. Description of Related Art

The conventional flip-chip semiconductor packaging technique is used mainly for attaching solder bumps to the corresponding solder pads formed over a chip, so as to electrically connect the chip to a chip carrier. Compared with the wire bonding technique, circuit paths formed by the flip-chip semiconductor packaging technique are shorter and have a better electrical quality. Further, the heat dissipation efficiency of the flip-chip semiconductor package can be improved in that the non-active (back) surface of the chip of the flip-chip semiconductor package is exposed to the ambience.

According to the disclosures of the U.S. Pat. Nos. 6,111,321, 6,107,180, and 6,586,323, before attaching the solder bumps on the chip by the flip-chip technique, an Under Bump Metallurgy (UBM) layer is formed on the solder pads of the chip. Thus, the solder bumps are soldered firmly onto the solder pads. However, when being electrically connected to the substrate during a reflow process and heated to a certain high temperature, the solder bumps will melt and collapse (i.e., wetting), resulting in adjacent solder bumps bridged.

Figure 1A:
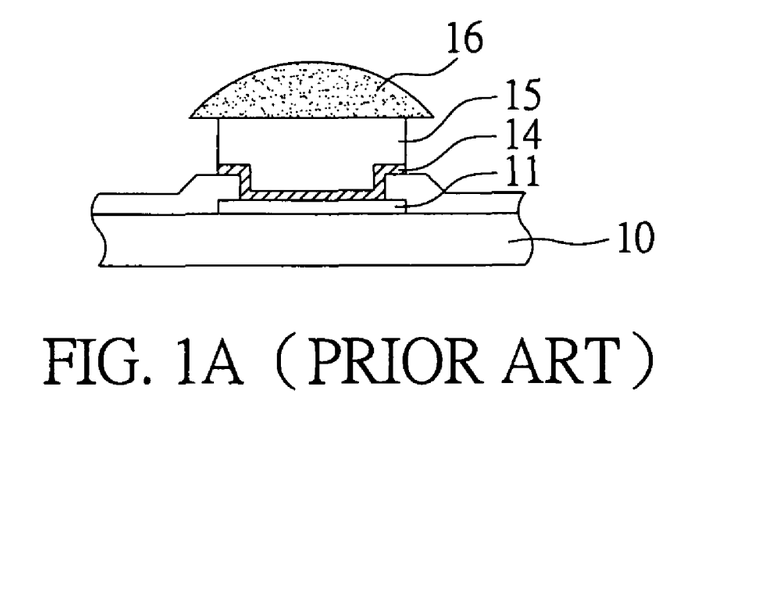
FIG. 1A is a schematic diagram showing a conductive bump having a copper pillar formed over a UBM layer of a chip according to the prior art.

Referring to FIG. 1A, a copper pillar 15 with a height of approximately 30 to 90 m is formed over a UBM layer 14 of a solder pad 11 formed over a chip 10, as disclosed in the U.S. Pat. Nos. 6,229,220, 5,656,858, 5,466,635, and 6,578,754. A solder material 16 is then applied over the copper pillar 15 to form a high standoff bump, allowing the chip 10 to be electrically connected to a chip carrier, such as a substrate. Since the melting point of copper is higher than the temperature required for the reflow process for reflowing the solder material 16, the copper pillar 15 will not collapse during reflow and thereby adjacent pillars 15 will not be bridged to cause short circuit problems.

Figure 1B:
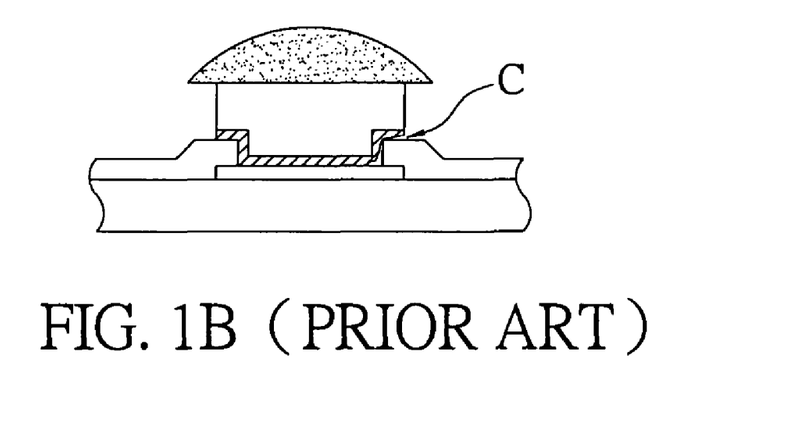
FIG. 1B is a schematic diagram showing delamination of the UBM layer caused by an excessively large amount of stress delivered through the copper pillar according to prior art.

A larger amount of thermal stress due to the mismatch of the thermal expansion coefficient between the chip and the chip career can be absorbed by the aforementioned high standoff bump when compared with the prior art. However, in the case that a larger-sized chip, such as 15×15 mm or above is used, such high standoff bumps having the copper pillar in the corner positions of the chip usually bear a greater extent of thermal stress. Thus, those corner bumps of the chip are in general unable to effectively absorb the thermal stress imposed thereto. As a result, the UBM layer tends to crack or delaminate from the solder pad attached thereto ('C' in FIG. 1B), as shown in FIG. 1B, thereby causing electrical performance and reliability problems.

Accordingly, how to provide a large-sized semiconductor chip having conductive bumps capable of effectively absorbing thermal stress during temperature cycle so as to prevent cracking or delamination problems from occurring has become an important issue to be resolved in the industry.

SUMMARY OF THE INVENTION

In view of the foregoing drawbacks to conventional technologies a primary objective of the present invention is to provide a semiconductor device having conductive bumps and a fabrication method thereof that can enable the conductive bumps to effectively absorb the thermal stress during the temperature cycle.

Another objective of the present invention is to provide a semiconductor device having conductive bumps and a fabrication method thereof, that can prevent cracking or delamination problems at the interface between the conductive bump and the solder pad formed over a large-sized chip.

In order to attain the above and other objectives, the present invention provides a fabrication method for fabricating a semiconductor device having conductive bumps. The method of the present invention includes the steps of providing a semiconductor substrate having a plurality of solder pads and a passivation layer formed thereon, forming a plurality of first openings in the passivation layer so as to expose a desired part of each of the solder pads from the passivation layer; forming a first metallic layer over the passivation layer to electrically connect the exposed part of each of the solder pads; applying a second covering layer over the first metallic layer and the passivation layer, with a plurality of second openings formed to expose predetermined parts of the first metallic layer from the second covering layer; forming a second metallic layer over the second covering layer, to electrically connect the second metallic layer to each of the exposed parts of the first metallic layer; applying a third covering layer over the second metallic layer and the second covering layer, with a plurality of third openings formed in the third covering layer for exposing predetermined parts of the second metallic layer from the third covering layer; forming a metallic standoff over each of the exposed parts of the second metallic layer at a position corresponding to the solder pad disposed thereunder; and forming a solder material over the metallic standoff.

The fabrication method described previously for producing a semiconductor device having conductive bumps further includes the step of forming a third metallic layer over each of the exposed parts of the second metallic layer, for making the third metallic layer electrically connect to the second metallic layer; and then forming a metallic standoff over the corresponding third metallic layer and a solder material over the metallic layer.

Moreover, a first covering layer can be applied over the solder pads and the passivation layer over the semiconductor substrate, with a plurality of openings formed for exposing a desired part of each of the solder pads. Then, the first metallic layer is formed and electrically connected to each of the solder pads via the openings over the first covering layer.

The semiconductor substrate described in the above can be a semiconductor chip or a wafer, and the passivation layer can be a polyimide (PI) layer or a silicon nitride (SiN) layer. The first and the second covering layers can each be a dielectric layer made of a benzo-cyclo-butene (BCB) or a PI material, while the third covering layer can be a dielectric layer or a solder mask layer.

The first and the second metallic layers are redistribution layers (RDL), and the material of which can be aluminum, nickel-vanadium alloy, copper, or titanium. The third metallic layer can be a UBM layer, and the material of which can be copper, nickel-vanadium alloy, copper, or titanium.

The present invention further provides a semiconductor device having conductive bumps. The semiconductor device includes a semiconductor substrate having a plurality of solder pads and a passivation layer formed thereon, wherein a plurality of first openings are formed in the passivation layer so as to expose a desired part of each of the solder pads from the passivation layer; a first metallic layer formed over the passivation layer for being electrically connected to the exposed parts of the solder pad; a second covering layer applied over the first metallic layer and the passivation layer, with a plurality of second openings formed for exposing predetermined parts of the first metallic layer; a second metallic layer formed over the second covering layer for being electrically connected to the exposed parts of the first metallic layer; a third covering layer, applied over the second metallic layer and the second covering layer with a plurality of third openings for exposing predetermined parts of the second metallic layer; a metallic standoff formed over each of the exposed parts of the second metallic layer so as to protrude from each corresponding one of the third openings of the third covering layer; and a solder material formed over the metallic standoff. The position of the metallic standoff thus corresponds to the solder pad positioned thereunder.

Moreover, the semiconductor device having conductive bumps can further include a third metallic layer formed over each of the exposed parts of the second metallic layer via the third openings of the third covering layer, thereby allowing the third metallic layer to be electrically connected to the second metallic layer. Then, a metallic standoff and a solder material are in turn formed over the third metallic layer.

Furthermore, according to another embodiment of the present invention, the semiconductor device having conductive bumps includes a first covering layer applied over the solder pad and the passivation layer formed over the semiconductor substrate. The first covering layer are further formed with a plurality of openings for exposing desired parts of the solder pads, such that when the first metallic layer is formed over the first covering layer, the first metallic layer is electrically connected to the exposed part of each of the solder pads via each of the openings of the first covering layer.

Compared with the prior art, in a semiconductor device having conductive bumps and a fabrication method thereof, according to the present invention, a plurality of covering layers and metallic layers are formed over the semiconductor substrate having solder pads and a passivation layer, the metallic layers are electrically connected to the solder pads, and the outermost covering layer formed with openings is disposed on the metallic layers, wherein the openings are corresponding in position to the solder pads disposed thereunder. The uppermost metallic layer is exposed from the outermost covering layer via a plurality of openings. It thus allows a plurality of metallic standoffs to be formed over and electrically connected to the uppermost metallic layer via the openings of the outermost covering layer. Accordingly, the covering layers and the metallic layers are capable of providing the conductive bumps each formed by the metallic standoff and a solder material applied over the metallic standoff a buffering effect for effectively absorbing the thermal stress imposed on the conductive bumps. As a result, cracking and delamination of the conductive bumps from the underlying metallic layer can be effectively prevented in the application of a large-sized semiconductor chip or wafer.

DETAILED DESCRIPTION OF PREFERRED EMBODIMENTS

First Embodiment

Referring to FIGS. 2A through 2F, the method for fabricating a semiconductor device having conductive bumps according to the first embodiment of the present invention is shown. For the sake of simplification, a segment of the semiconductor device with a conductive bump formed thereon in a cross-sectional view is illustrated.

Figure 2A:
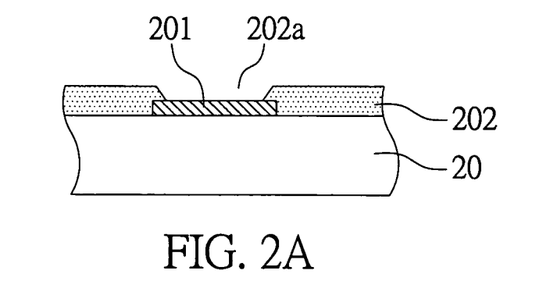
FIGS. 2A through 2F are partially schematic diagrams showing the steps for fabricating the semiconductor device having conductive bumps and according to the first embodiment of the present invention.

As shown in FIG. 2A, a semiconductor substrate 20, such as a semiconductor chip or a wafer having a plurality of chip units is provided, and the semiconductor chip 20 has a plurality of solder pads 201 and a passivation layer 202 thereon. The passivation layer 202 is formed with a plurality of first openings 202a to expose a desired part of each of the solder pads 201. The passivation layer 202, such as a polyimide (PI) layer, is used for protecting the semiconductor substrate 20.

Figure 2B:
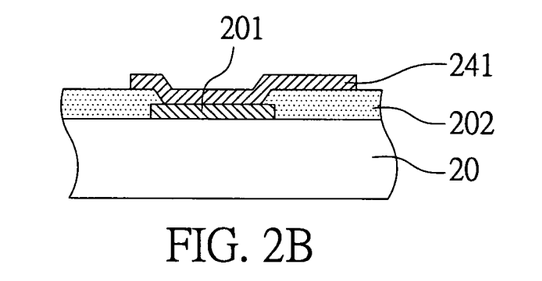

As shown in FIG. 2B, a first metallic layer 241 is formed on the semiconductor chip 20 and electrically connected to the exposed part of each of the solder pads 201. The first metallic layer 241 may be an RDL layer and can be made of a material selected from aluminum, nickel-vanadium alloy, copper and titanium.

Figure 2C:
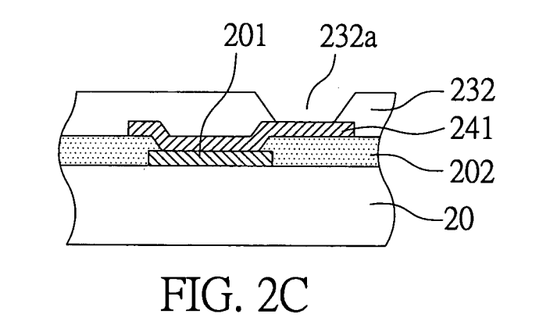

As show in FIG. 2C, a second covering layer 232 is used for covering the first metallic layer 241 and the passivation layer 202. The second covering layer 232 is further formed with a plurality of second openings 232a for exposing the first metallic layer 241. The second covering layer 232 can be a BCB layer or a PI layer.

Figure 2D:
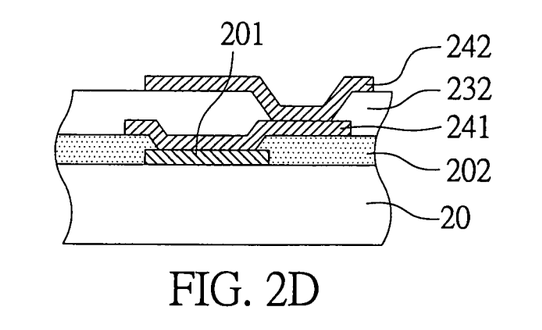

As shown in FIG. 2D, a second metallic layer 242 is formed on the exposed first metallic layer 241 via the second openings 232a, as well as the second covering layer 232, so as to be electrically connected to the first metallic layer 241. The second metallic layer 242 may be a RDL layer and can be made of a material selected from aluminum, nickel-vanadium alloy, copper, and titanium.

Figure 2E:
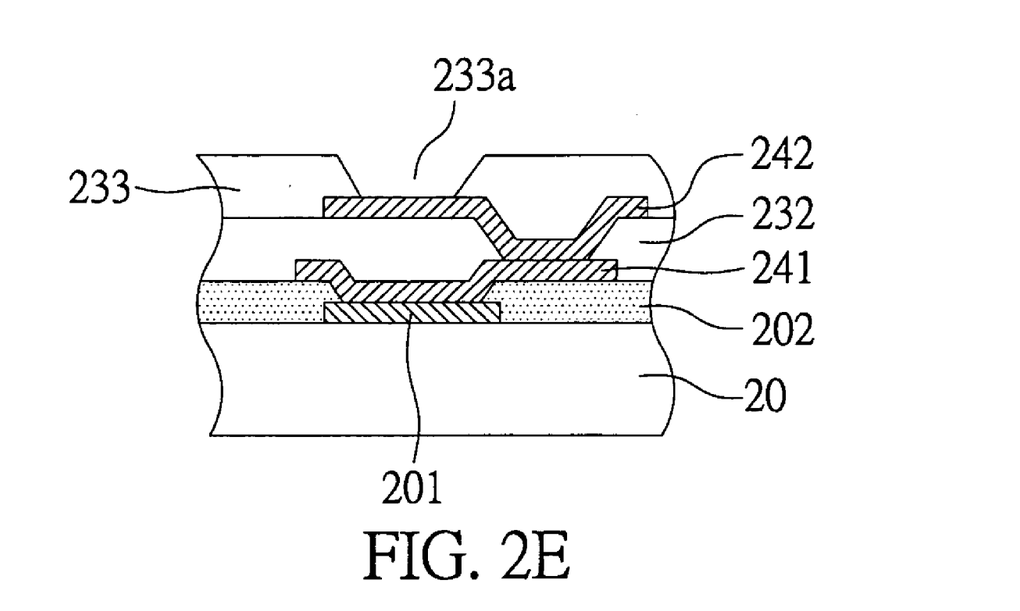

As shown in FIG. 2E, a third covering layer 233 is formed on the second metallic layer 242 and the second covering layer 232, with a plurality of third openings 233a formed in positions corresponding to the solder pads 201 underneath for exposing predetermined parts of the second metallic layer 242. The third covering layer 233 can be a dielectric layer (such as a BCB layer or a PI layer) or a solder mask layer.

Figure 2F:
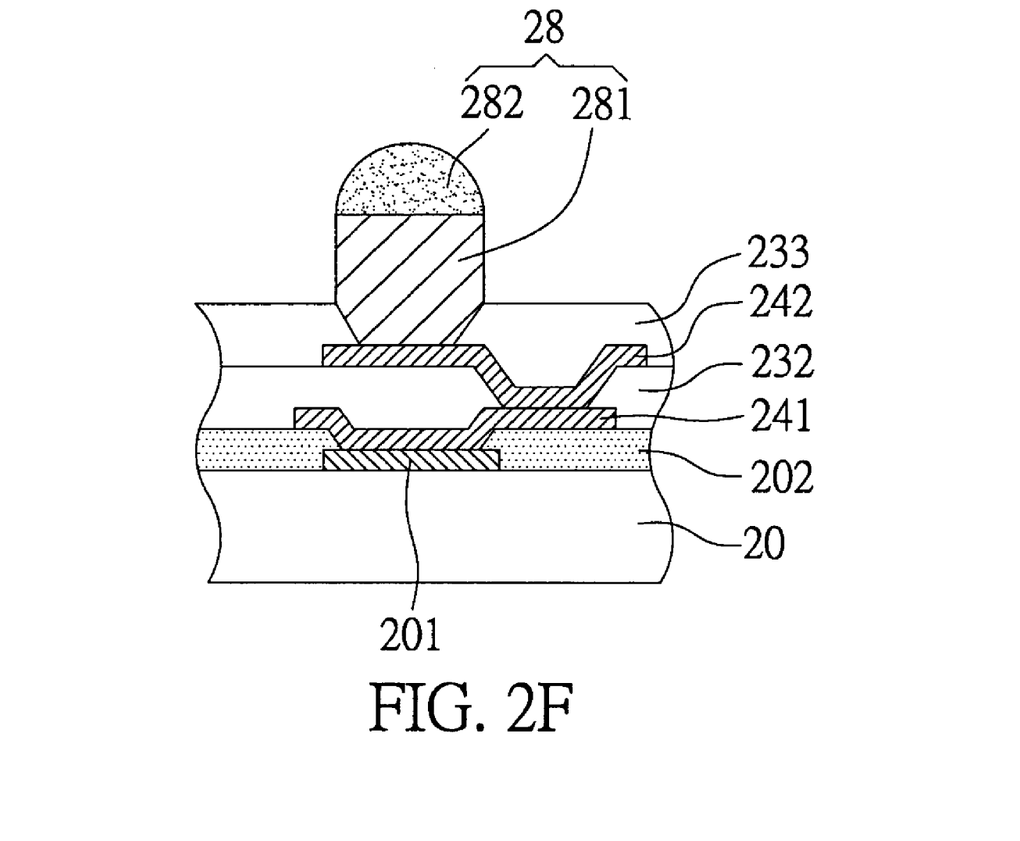

As shown in FIG. 2F, a metallic standoff 281 is formed on each of the exposed parts of the second metallic layer 242 by electroplating or electroless-plating. On the top surface of the metallic standoff 281, a cap-shaped solder material 282 can be formed, so as to allow the metallic standoff 281 and the solder material 282 to form into the conductive bump 28. In addition, the metallic standoff 281 may be a copper pillar or the like.

According to the method described above, the semiconductor device having conductive bumps of the present invention is illustrated in FIG. 2F, which includes the semiconductor substrate 20 having the solder pads 201 and the passivation layer 202 with a plurality of first openings 202a to expose a desired part of each of the solder pads 201; the first metallic layer 241 formed to electrically connect the exposed part of each of the solder pads 201; the second covering layer 232 applied over the first metallic layer 241 and the passivation layer 202, with a plurality of second openings 232a for exposing predetermined parts of the first metallic layer 241; the second metallic layer 242 formed to electrically connect the exposed parts of the first metallic layer 241; and the third covering layer 233 formed over the second metallic layer 242 and the second covering layer 232, with a plurality of third openings 233a formed for exposing predetermined parts of the second metallic layer 242.

The semiconductor substrate 20, such as a semiconductor chip or a wafer including a plurality of chip units, has the solder pads 201 disposed thereon. The passivation layer 202, applied over a surface of the semiconductor substrate 20, has the openings 202a for exposing parts of a solder pad 201. The passivation layer 202, such as a PI layer, is used for protecting the semiconductor substrate 20.

The first metallic layer 241, formed over the passivation layer 202, is electrically connected to the parts of the solder pad 201 exposed outside the passivation layer 202. The first metallic layer 241 is an RDL, and can be made of a material selected from aluminum, nickel-vanadium alloy, copper and titanium.

The second covering layer 232, applied over the first metallic layer 241 and the passivation layer 202, forms openings for exposing parts of the first metallic layer 241. The second covering layer 232 can be a BCB covering layer or a PI covering layer, either of which is used for protecting the first metallic layer.

The second metallic layer 242, formed over the second covering layer 232, is electrically connected to the first metallic layer 241. The material of the second metallic layer 242, such as an RDL can be selected from aluminum, nickel-vanadium alloy, copper, or titanium.

The third covering layer 233, formed on the second metallic layer 242 and the second covering layer 232, has the openings 233a in the positions corresponding to the upper position of the solder pad 201, for exposing parts of the second metallic layer 242. The third covering layer 233 can be a dielectric layer (such as a BCB layer or a PI layer) or a solder mask.

The metallic standoff 281 has a center point that is approximately in the same location as that of the solder pad 201. The metallic standoff 281 has a solder material 282, similar to a cap-shaped tin-alloy.

In this embodiment, the second covering layer 232, the third covering layer 233, the first metallic layer 241, and the second metallic layer 242 are located between the conductive bump 28 and the solder pad 201, so as to provide a better buffering effect to prevent cracking or delamination of the UBM layer.

Second Embodiment

Figure 3:
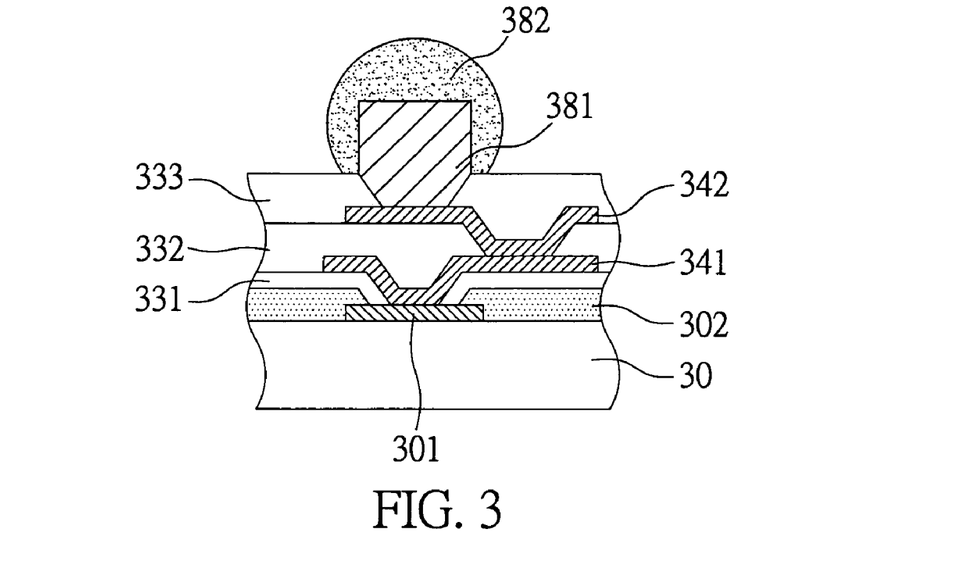
FIG. 3 is a partially schematic diagram showing the semiconductor device having conductive bumps according to the second embodiment of the present invention.

Referring to FIG. 3, a semiconductor device having conductive bumps according to the second embodiment of the present invention is shown. The semiconductor device is substantially the same as that according to the first embodiment. The major difference is that when the material of the passivation layer of the semiconductor device is a silicon nitride layer, a first covering layer can be applied over the passivation layer. Then a first metallic layer, a second covering layer, a second metallic layer, a third covering layer, a plurality of metallic standoff, and a solder material are sequentially formed over the first covering layer.

As shown in FIG. 3, a first covering layer 331 is applied over a passivation layer 302 of a semiconductor substrate 30, so as to expose a desired part of each of the solder pads 301 from the passivation layer.

A first metallic layer 341 is formed over the first covering layer 331 and electrically connected to the parts of the solder pad 301 exposed outside the first covering layer 331. Then, a second covering layer 332 is applied over the first metallic layer 341 and the first covering layer 331, so as to expose a desired part of each of the of the first metallic layer 341 and forming a second metallic layer 342 thereon. The second metallic layer 342 is electrically connected to the first metallic layer 341 via the exposed parts of the first metallic layer 341. Further, a third covering layer 333 is applied over the second metallic layer 342 and the second covering layer 332. A plurality of openings are formed through the third covering layer 333, so as to expose a desired part of the second metallic layer 342 to form a metallic standoff 381 and a ball-shaped solder material 382 over the metallic standoff 381. The position of the metallic pillar 381 corresponds to the solder pad 301 positioned thereunder.

Third Embodiment

Figure 4:
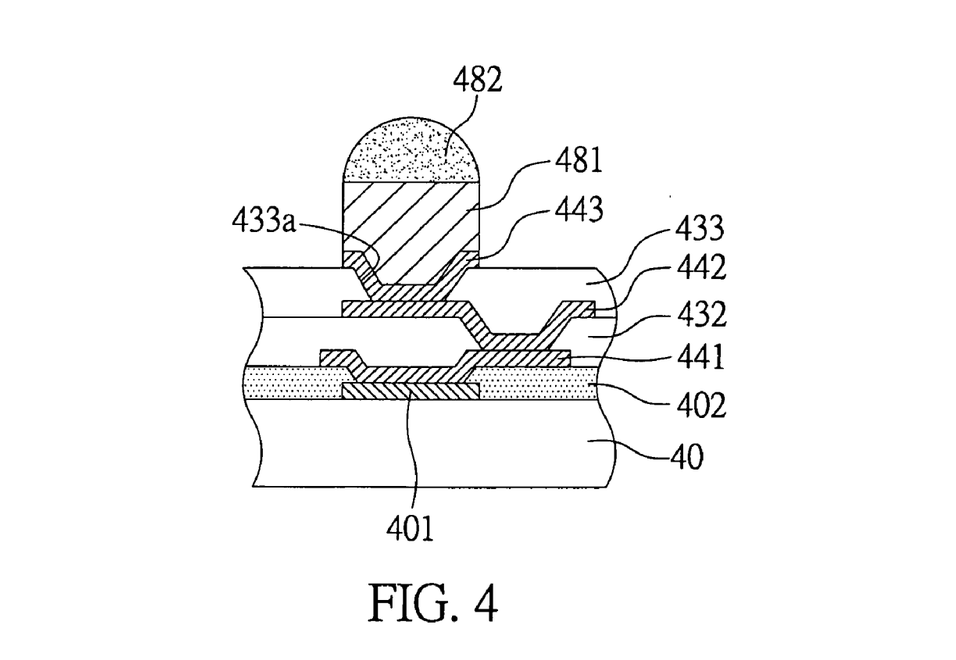
FIG. 4 is a schematic diagram showing the semiconductor device having conductive bumps according to the third embodiment of the present invention.

Referring to FIG. 4, a semiconductor device having conductive bumps according to the third embodiment of the present invention is shown. The semiconductor device in this embodiment is substantially the same as that according to the first embodiment. The major difference is that a third metallic layer 443 is formed over the parts of the second metallic layer 442 and electrically connected to the second metallic layer 442

Afterwards, the conductive bump having a metallic standoff 481 and a cap-shaped solder material 482 are sequentially formed over the third metallic layer 443, so as to constitute a semiconductor device having conductive bumps of the present invention.

Fourth Embodiment

Figure 5:
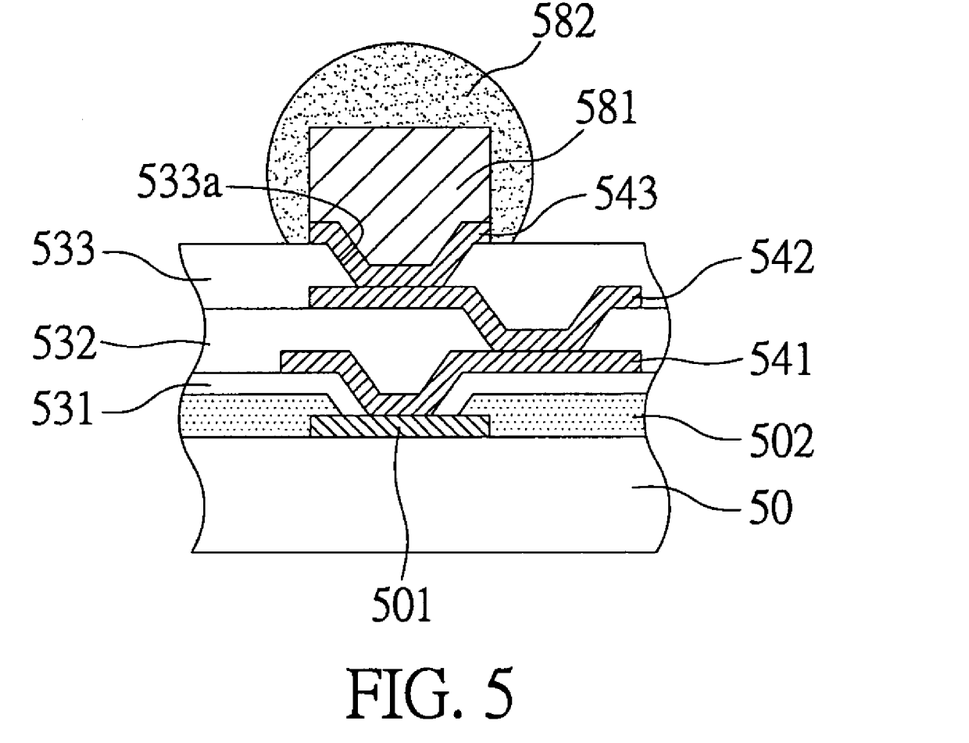
FIG. 5 is a schematic diagram showing the semiconductor device having conductive bumps according to the fourth embodiment of the present invention.

Referring to FIG. 5, a cross-sectional view showing a semiconductor device having conductive bump according to the fourth embodiment of the present invention is shown. The semiconductor device in this embodiment is substantially the same as the one described previously in the second embodiment. The major difference is that a third metallic layer 543, formed over the second metallic layer 542 exposed partly outside the openings 533a of the third covering layer 533, is electrically connected to the second metallic layer 542, wherein the third metallic layer 543 is a UBM layer.

Afterwards, the conductive bump having a metallic pillar 581 and a ball-shaped solder material 582 is formed over the third metallic layer 543, so as to constitute a semiconductor device having conductive bumps.

Therefore, according to a semiconductor device having conductive bumps and a fabrication method thereof in the present invention, additional covering layers and metallic layers are disposed on the semiconductor substrate, the metallic layers are electrically connected to the solder pads, an outermost covering layer is formed, and conductive bumps containing metallic pillars and cap-shaped or ball-shaped solder materials are formed on the metallic layers. Accordingly, the covering layers and the metallic layers are capable of providing the conductive bumps each formed by the metallic standoff and a solder material applied over the metallic standoff a buffering effect for effectively absorbing the thermal stress imposed on the conductive bumps. As a result, cracking of the conductive bumps and delamination of the conductive bumps from the underlying metallic layer can be effectively prevented in the application of a large-sized semiconductor chip or wafer.

The covering layers and the metallic layers disposed beneath the conductive bumps provide a buffering effect in stress absorption, to reduce cracking and delamination of the UBM layers formed directly over the solder pad.

The embodiments described above are only exemplified to illustrate the rationales and related functions according to the present invention, instead of limiting the scope of the present invention. Accordingly, all modifications and variations completed by those with ordinary skill in art should fall within the scope of the present invention defined by the appended claims.

The invention has been described using exemplary preferred embodiments. However, it is to be understood that the scope of the invention is not limited to the disclosed embodiments. On the contrary, it is intended to cover various modifications and similar arrangement. The scope of the claims should be accorded the broadest interpretation so as to encompass all such modifications and similar arrangements.

What is claimed is:

1. A semiconductor device having conductive bumps, comprising:
    a semiconductor substrate having a plurality of solder pads and a passivation layer formed thereon, wherein the passivation layer is formed with a plurality of first openings for exposing a desired part of each of the solder pads;
    a first covering layer applied over the solder pads and the passivation layer for exposing parts of each of the solder pads exposed by the first openings;
    a first metallic layer formed over the exposed part of each of the solder pads via the first openings and the first covering layer, and electrically connected to the solder pads;
    a second covering layer applied over the first metallic layer and the first covering layer, the second covering layer having a plurality of second openings formed to expose predetermined parts of the first metallic layer, wherein each of the second openings is free from corresponding in position to each of centers of the solder pads, respectively;
    a second metallic layer formed over the second covering layer and electrically connected to the first metallic layer;
    a third covering layer applied over the second metallic layer and the second covering layer, the third covering layer having a plurality of third openings for exposing parts of the second metallic layer, wherein each of centers of the third openings corresponds in position to each of the centers of the solder pads, respectively;
    a metallic standoff formed on each of the exposed parts of the second metallic layer exposed outside the openings of the third covering layer; and
    a solder material formed on an outer surface of the metallic standoff.

2. The semiconductor device of claim 1, wherein the passivation layer is a silicon nitride layer, the first and the second covering layers are each selected from a benzo-cyclo-butene layer or a polyimide layer, and the third covering layer is selected from a dielectric layer or a solder mask.

3. The semiconductor device of claim 1, wherein a third metallic layer is further formed in the openings of the third covering layer and electrically connected to the parts of the second metallic layer to form the metallic standoff and the solder material.

4. The semiconductor device of claim 1, wherein the passivation layer is a polyimide layer, the first and the second covering layers are each selected from a benzo-cyclo-butene layer or a polyimide layer, and the third covering layer is selected from a dielectric layer or a solder mask.

5. The semiconductor device of claim 1, wherein the semiconductor substrate is selected from a semiconductor chip or a wafer including a plurality of chip units.

6. The semiconductor device of claim 1, wherein the solder material is formed to be cap-shaped or ball-shaped.

* * * * *